(12) United States Patent
Hiraga (10) Patent No.: US 7,818,598 B2
(45) Date of Patent: Oct. 19, 2010

(54) SEMICONDUCTOR DEVICE

(75) Inventor: Takefumi Hiraga, Kawasaki (JP)

(73) Assignee: Nec Electronics Corporation, Kanagawa (JP)

( * ) Notice: Subject to any disclaimer, the term of this patent is extended or adjusted under 35 U.S.C. 154(b) by 711 days.

(21) Appl. No.: 11/749,818

(22) Filed: May 17, 2007

(65) Prior Publication Data
US 2007/0283310 A1    Dec. 6, 2007

(30) Foreign Application Priority Data
Jun. 6, 2006    (JP) ............................. 2006-157313

(51) Int. Cl.
*G06F 1/00* (2006.01)
*G06F 1/32* (2006.01)

(52) U.S. Cl. ...................... 713/323; 713/300; 713/320; 713/324; 365/63; 365/226

(58) Field of Classification Search ................. 713/300, 713/320, 323, 324; 365/63, 226
See application file for complete search history.

(56) References Cited

U.S. PATENT DOCUMENTS 6,738,934 B2 * 5/2004 Frank et al. .................. 714/51

6,879,538 B2 * 4/2005 Lovett et al. ................ 365/226
2006/0082384 A1 * 4/2006 Deogun et al. ................ 326/31

FOREIGN PATENT DOCUMENTS

JP    2004-186666    7/2004

* cited by examiner

*Primary Examiner*—Thomas Lee
*Assistant Examiner*—Michael J Brown
(74) *Attorney, Agent, or Firm*—Young & Thompson (57) ABSTRACT

A semiconductor device provided on a semiconductor substrate having a cell placing area disposed on a semiconductor substrate, the cell placing area including a plurality of basic cells supplied with power from a local power supply line, a global power supply line to supply power to the local power supply line, at least one switch cell having a terminal electrically connected to the global power supply line, another terminal electrically connected to the local power supply line and a switch to turn on and off power supply from the global power supply line to the local power supply line and a repeater circuit disposed in the cell placing area, the repeater circuit supplied with power from the global power supply line without interposing the switch.

20 Claims, 9 Drawing Sheets

RELATED ART

SEMICONDUCTOR DEVICE

INCORPORATION BY REFERENCE

The disclosure of U.S. patent application Ser. No. 11/526,577 filed on Sep. 26, 2006 including the specification, drawings and abstract is incorporated herein by reference in its entirety.

BACKGROUND OF THE INVENTION

1. Field of the Invention

The present invention relates to a semiconductor device.

2. Description of Related Art

Semiconductor devices are used for various purposes. In recent years, semiconductor devices are often used in an apparatus operating with electric power supplied from a battery. Semiconductor devices used in an apparatus with power source from battery are especially desired to consume little power. A technique for suppressing power consumption of a semiconductor device is disclosed in Japanese Unexamined Patent Application Publication No. 2004-186666, for example. Such technique aims to reduce the power consumption of a semiconductor device by suspending to supply power to non-operating circuits among circuits in the semiconductor device.

Figure 1:
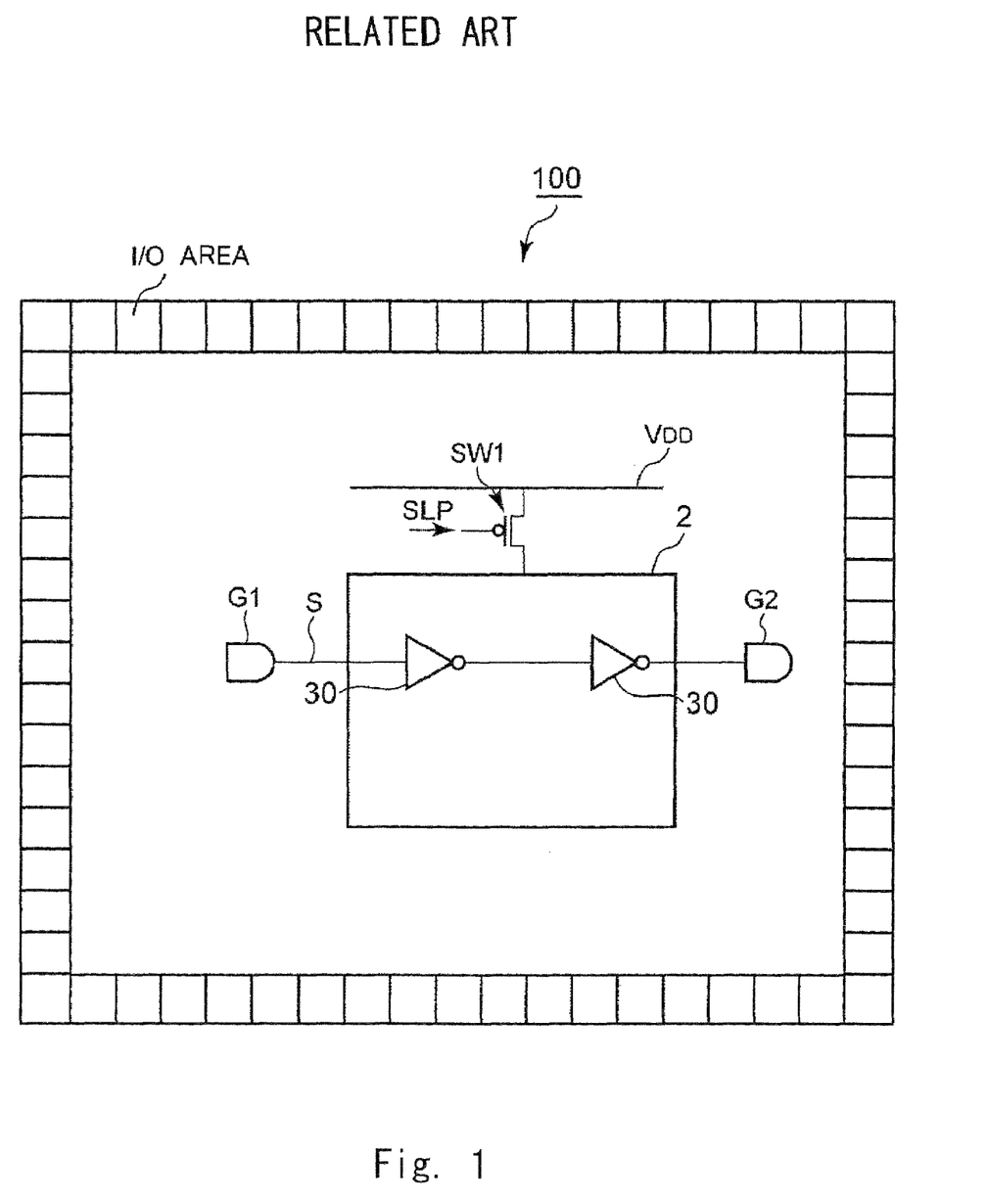
FIG. 1 is a diagram for explaining a conventional technique.

Inventor has now discovered that there are following problems in the conventional technique. FIG. 1 is a diagram for explaining the conventional technique. In FIG. 1, in a circuit area 2 inside a semiconductor 100, operations can be suspended for a predetermined period of time. In the period to enable to suspend the operations in the circuit area 2, a power supply control circuit (not shown) inside the semiconductor device 100 sends a control signal SLP to a switch SW1 so as to suspend supplying power from a power supply line VDD to the circuit area 2. This prevents leak current or the like from generating that is caused by transistors (not shown) in the circuit area 2, thereby reducing the power consumption of the semiconductor device. However communications between gates G1 and G2 interposing the circuit area 2 may be required even while the power supply to the circuit area 2 is suspended. Specifically, if a repeater circuit (interchange circuit) 30 for relaying a signal S from the gate G1 to the gate G2 is disposed in the circuit area 2, the repeater circuit 30 does not operate while the switch SW1 is in off state. Therefore, in the period when the power supply to the circuit area 2 is suspended, the signal S cannot be communicated between the gates G1 and G2 that are disposed interposing the circuit area 2 therebetween.

Figure 2:
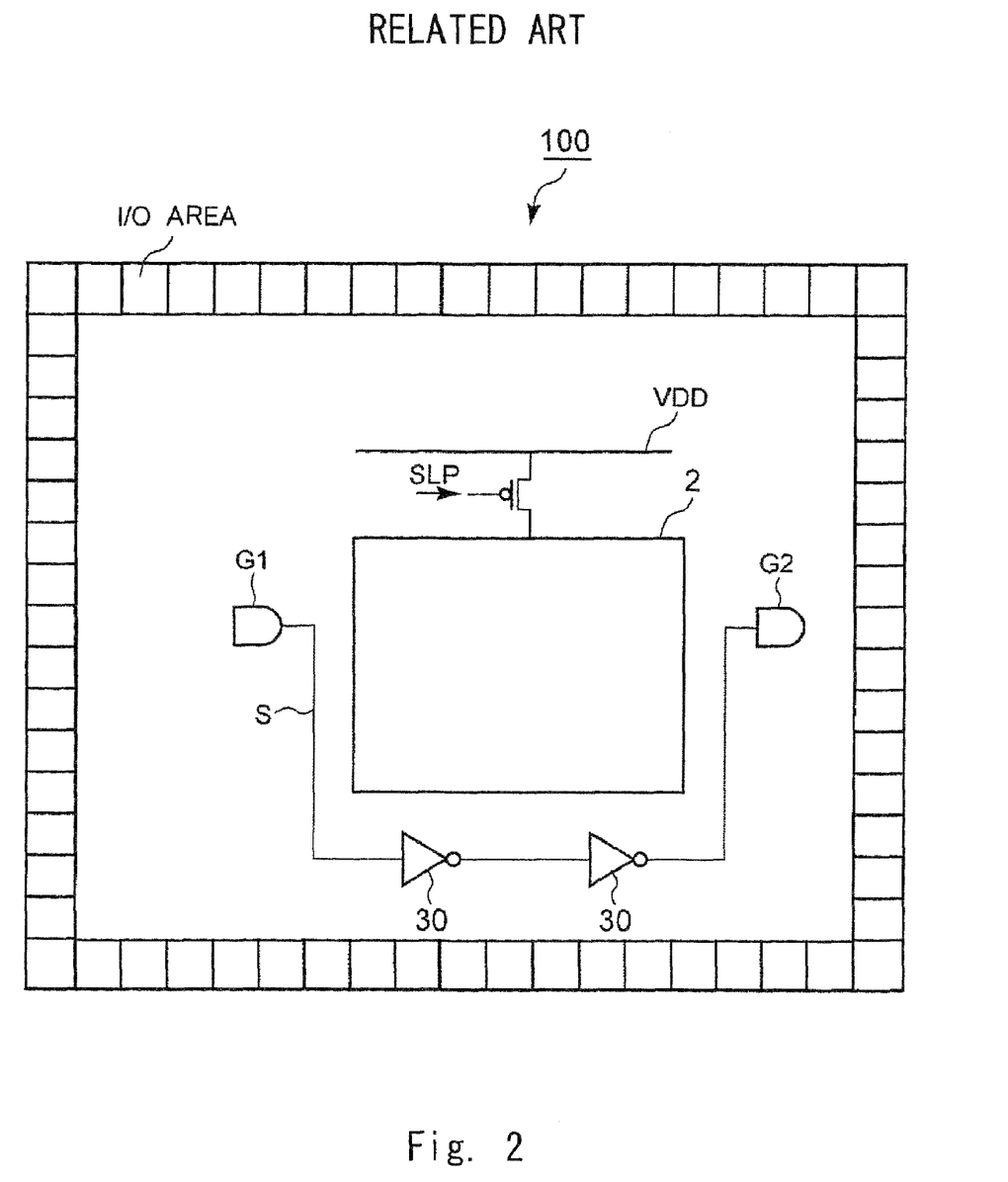
FIG. 2 is a diagram for explaining a conventional technique.

To avoid such problem, as shown in FIG. 2, there is a technique to bypass the circuit area 2 to dispose the repeater circuit 3. However wiring must be routed long way, causing signals to be delayed and complicate the adjustment of timings.

SUMMARY

In one embodiment of the present invention, there is provided a semiconductor device having a repeater circuit disposed in the cell placing area whose power supply from a global line is turned on and off by a switch. The power supply to the repeater circuit is supplied from a global power supply line without interposing the switch.

Thus the power supply to the cell placing area can be turned on and off, and at the same time, the repeater circuit disposed in the cell placing area can be supplied with the power to operate.

Further, by using this repeater circuit, signals can be communicated across the cell placing area in either the power supply to the cell placing area is turned on or off.

For example the semiconductor device of another embodiment is provided over the semiconductor substrate having a cell placing area disposed on a semiconductor substrate, the cell placing area including a plurality of basic cells supplied with power from a local power supply line, a global power supply line to supply power to the local power supply line, at least one switch cell having a terminal electrically connected to the global power supply line, another terminal electrically connected to the local power supply line and a switch to turn on and off power supply from the global power supply line to the local power supply line, a repeater circuit disposed in the cell placing area, the repeater circuit supplied with power from the global power supply line without interposing the switch.

A preferred embodiment of the present invention enables to avoid situations that require to route signal lines.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIRST EMBODIMENT

A first embodiment of the present invention is described hereinafter in detail with reference to the drawings. In the description that follows, it is assumed that a semiconductor device incorporating an embodiment of the present invention is constituted of a gate array or a cell-based IC (Integrated Circuit). Incidentally, the abovementioned assumption is illustrative purposes only and there is no limitation in the semiconductor device to incorporate the present invention. Further, the semiconductor circuit described in this embodiment can be applied to a device that is desired to suppress leak current from increasing. Such device generally supports two operation modes which are standby mode (in which power supply to non-operating part is temporarily suspended) and normal mode (in which a normal operation is carried out).

Accordingly in the following embodiment, a semiconductor device that transits from the normal mode to the standby mode by suspending power supply to a particular area is described as an example of the present invention. Note that this configuration does not limit the configuration of the semiconductor circuit incorporating the present invention. The present invention can be incorporated when controlling power supply to an entire macro area 1, which is described later in detail, and when controlling power supply by each functional cell.

Figure 3:
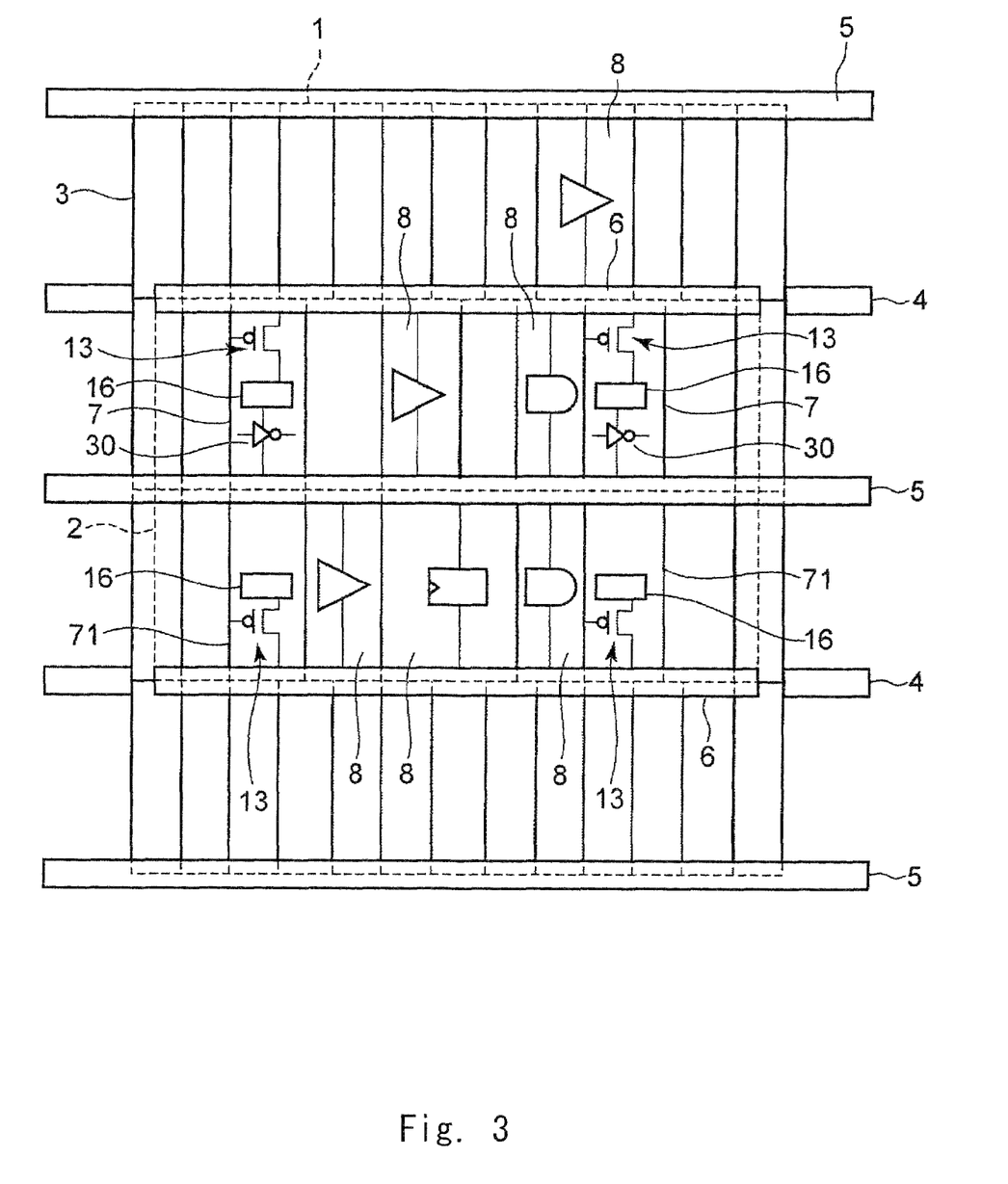
FIG. 3 is a plan view according to a first embodiment of the present invention.

FIG. 3 is a plan view of the configuration of the semiconductor circuit according to the first embodiment of the present invention. The semiconductor circuit of this embodiment is constituted of a plurality of basic cells 3 arranged in array over a semiconductor substrate. In the basic cell 3, a plurality of logic gates (transistor circuits) are mounted. By providing wiring to the logical gates, functional cells 8 are formed that fulfill predetermined functions including inverter and NAND gate. By combining a plurality of functional cells 8, the macro area 1 having more complicated function can be formed.

The macro area 1 includes a cell placing area (hereinafter referred to as a power supply control area 2) whose power supply is suspended correspondingly to predetermined conditions. The power supply control area 2 is made up of a plurality of switch cells 7 that are formed over a semiconductor substrate. Details of the configuration of the switch cell 7 are described later in detail. Furthermore, in the normal mode, in the macro area 1, electric power is supplied to operate the functional cells 8.

As shown in FIG. 3, in the semiconductor circuit of this embodiment, a first local power supply line 4, a first local ground line 5 and a second local power supply line 6 are provided over an upper layer (hereinafter referred to as a first wiring layer) of the abovementioned semiconductor substrate. The first local power supply line 4 is a metal line for supplying a power supply voltage VDD. The first local ground line 5 is a metal line for supplying a ground potential GND. The second local power supply line 6 is a metal line for supplying the power supply voltage VDD to the power supply control area 2 and is electrically isolated from the first local power supply line 4.

Note that in this embodiment, a case is explained in which the first local power supply line 4, first local ground line 5 and second local power supply line 6 are formed over the same layer (which is abovementioned first wiring layer).

Figure 4:
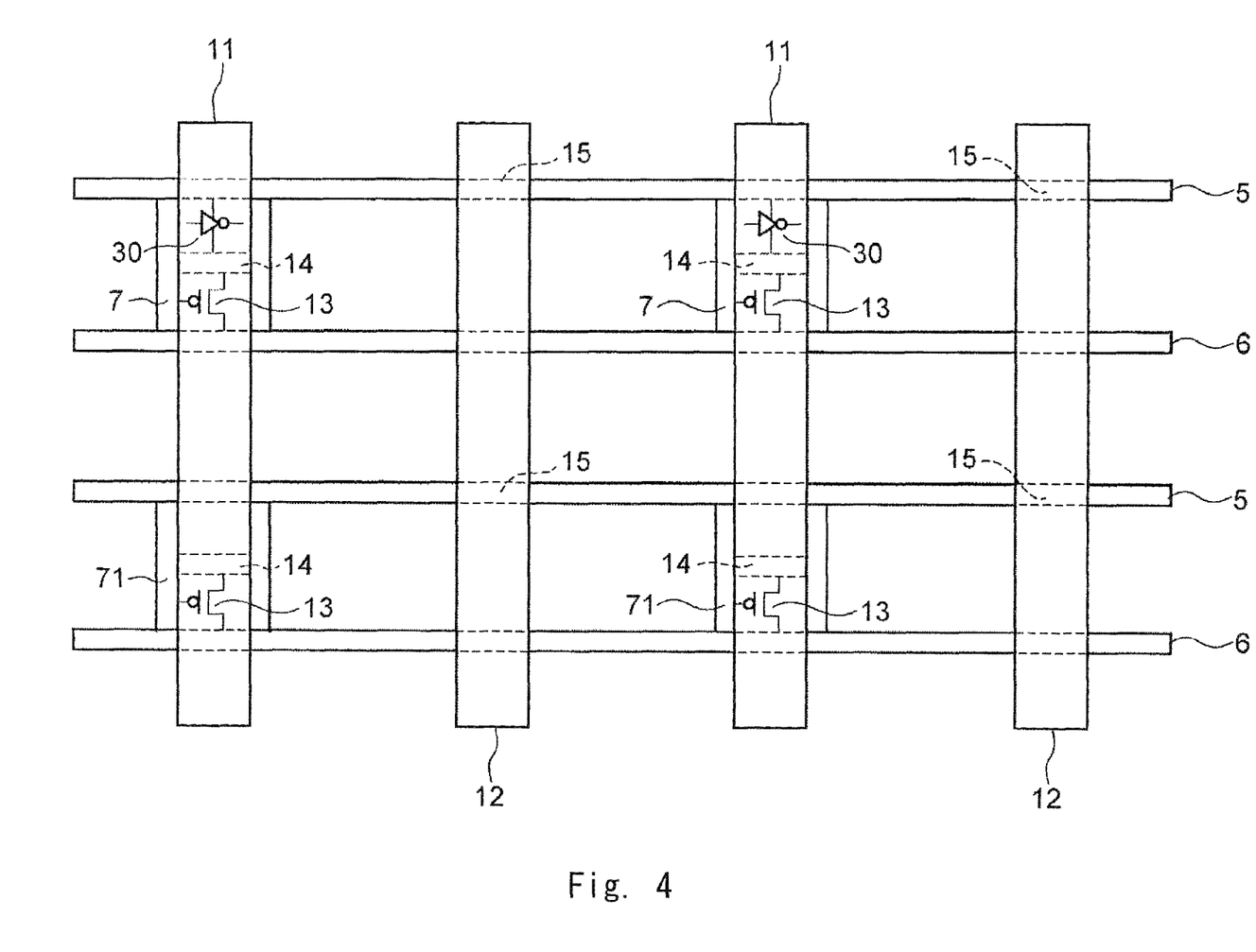
FIG. 4 is a plan view according to the first embodiment of the present invention.

Hereinafter, power supply to the power supply control area 2 is described in detail. FIG. 4 shows the arrangement of the wiring associated with the power supply to the power supply control area 2, the configuration of the switch cells 7 and the arrangement of each line influencing the switch cell 7 when viewed in a plan view. As set forth above, the switch cells 7 are formed over the substrate and the first local ground lines 5 and second local power supply lines 6 are formed over the first wiring layer. Further, global power supply lines 11 and global ground lines 12 are formed over a layer that is different from the first wiring layer (hereinafter referred to as a power supply wiring layer).

As shown in FIGS. 3 and 4, the switch cell 7 includes a switch transistor 13 and a repeater circuit 30. Incidentally, the repeater circuit 30 may not necessarily be included in all the switch cells 7. Depending on the number of signals to relay, a switch cell without a switch cell as with a cell 71 maybe disposed.

A first via contact 14 is provided between the switch transistor 13, repeater circuit 30 and global power supply line 11. The global power supply line 11 and global ground line 12 are placed almost in parallel at predefined intervals. Further, the first local ground line 5 and second local power supply line 6 are placed at predefined intervals and almost orthogonal to the global power supply line 11 (or global ground line 12). Furthermore, a second via contact 15 is provided between the first local ground line 5 and global ground line 12.

The power supply voltage VDD supplied from the global power supply line 11 is applied to a power supply terminal of the switch transistor 13 via the first via contact 14. By this configuration, the power supply voltage VDD supplied from the global power supply line 11 is provided to the second local power supply line 6 via the switch transistor 13 when the switch transistor 13 is activated. Conversely when the switch transistor 13 is deactivated, power supply from the global power supply line 11 to the second local power supply line 6 is suspended and power supply to the power supply control area 2 is suspended.

Here, the repeater circuit 30 is connected in away the power from the global line 11 can be supplied without interposing the switch transistor 13. Therefore, even when the switch transistor 13 is deactivated, the repeater circuit 30 can operate to relay an electrical signal communicated across the power supply control area 2.

Figure 5:
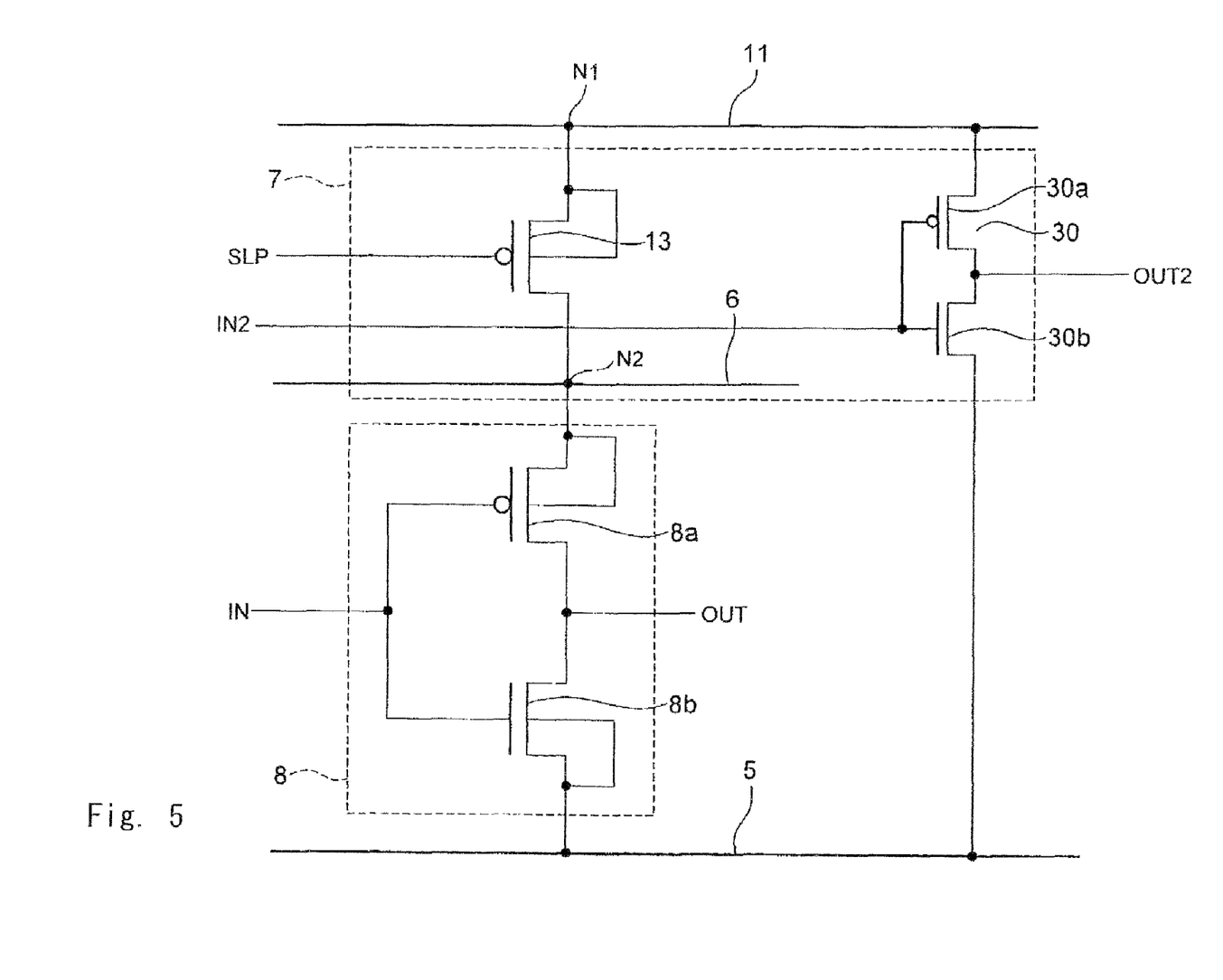
FIG. 5 is an equivalent circuit according to the first embodiment of the present invention.

FIG. 5 is a circuit diagram showing an example of the configuration of the semiconductor circuit according to this embodiment. The circuit diagram of FIG. 5 equivalently shows the connection of the switch cell 7 and functional cell 8. In the embodiment below, a case is described in which the repeater circuit 30 and functional cell 8 are inverters and switch transistor 13 is a P channel MOS transistor. Referring to FIG. 5, a control signal SLP is input to a gate of the switch transistor 13. A source terminal of the switch transistor 13 is connected to the global power supply line 11 via a node N1 and a drain terminal is connected to the second local power supply line 6 via a second node N2. Further, a back gate of the switch transistor is short-circuited to its source terminal.

The repeater circuit 30 is an inverter constituted of a PMOS transistor 30a and NMOS transistor 30b. A source terminal of the PMOS transistor 30a is connected to the global power supply line 11 and a source terminal of the NMOS transistor 30b is connected to the local ground line 5. Gate terminals of the transistor 30a and 30b are short-circuited to each other to receive an input IN2 of an electric signal that is communicated across the power supply control area 2. Drain terminals of the transistor 30a and 30b are short-circuited to each other to output an output OUT2 of an electric signal that is communicated across the power supply control area 2. In this way, the repeater circuit 30 repeats a signal that crosses the power supply control area 2.

The functional cell 8 includes a P channel MOS transistor having a back gate short-circuited to a power supply terminal and an N channel MOS transistor having a back gate short-circuited to an earth terminal. The switch cell 7 and functional cell 8 having the switch transistor 13 have wells including the transistors electrically isolated. Accordingly it is possible to have different voltages for a back gate voltage of the switch transistor 13 and a back gate voltage of the transistor constituting the functional cell 8. To make the power supply control area 2 be in the normal mode, the switch transistor 13, in response to the control signal SLP, supplies the power supply voltage VDD that is supplied from the global power supply line 11 to the second local power supply line 6. That is, the functional cell 8 is able to receive power supply from the global power supply line 11 to operate via the switch transistor 13 and second local power supply line 6.

At this time, a low-level signal is supplied to the switch transistor 13 as a control signal SLP sent from a power supply control circuit (not shown) provided on the same semiconductor substrate. To make the power supply control area 2 be in the standby mode, a high-level signal is supplied to the switch transistor as a control signal SLP.

Figure 6:
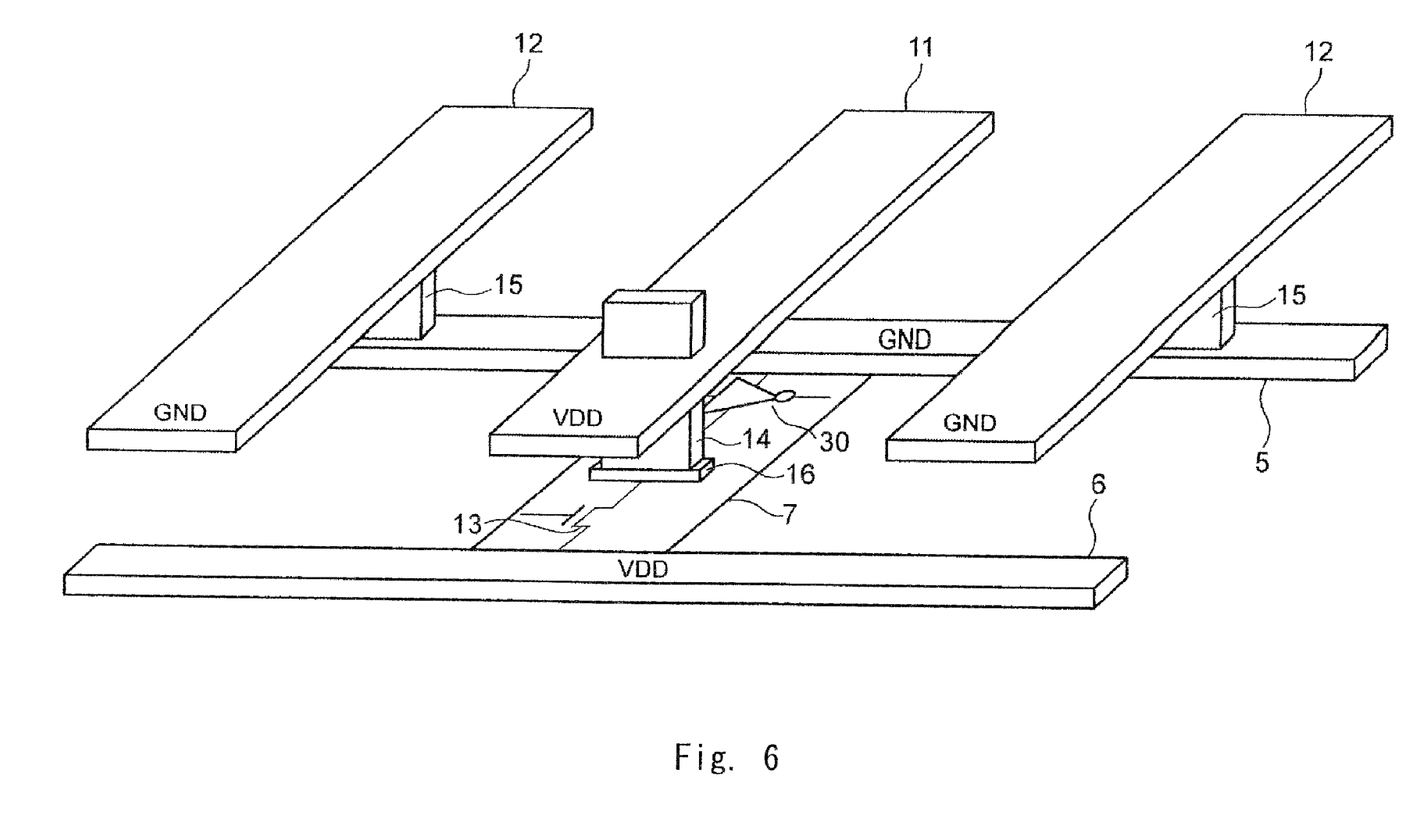
FIG. 6 is a three-dimensional schematic view according the first embodiment of the present invention.

FIG. 6 is a three-dimensional schematic view of the semiconductor device according to this embodiment. Referring to FIG. 6, the switch cell 7 having the switch transistor 13 and repeater circuit 30 is provided to a semiconductor substrate and the first wiring layer having the first local ground line 5 and second local power supply line 6 is provided to an upper layer of the substrate. The power supply wiring layer having the global power supply line 11 and global ground line 12 is provided over the upper layer of the first wiring layer. The power supply terminals of the global power supply line 11 and switch transistor 13 are connected to each other via the first via contact 14. Likewise, power supply terminals of the global power supply line 11 and repeater circuit 30 are connected to each other via the first via contact 14. Further, the global ground line 12 is connected with the first local ground line 5 via the second via contact 15.

As shown in FIG. 6, the first via contact 14 is formed to extend in vertical direction when the substrate face of the semiconductor device is leveled. Further, the switch cell 7 is disposed in a area below the global power supply line 11 when the substrate face of the semiconductor device is leveled. Specifically, when viewed in a plan view, the switch cell 7 and global power supply line 11 are viewed as if overlapped. By providing the switch cell 7 as above in the physical relationship between the global power supply line 11, first via contact 14, switch transistor 13 and second local power supply line 6, the path for the power supply voltage VDD supplied from the global power supply line 11 to reach the second local power supply line 6 can be optimized.

Figure 7:
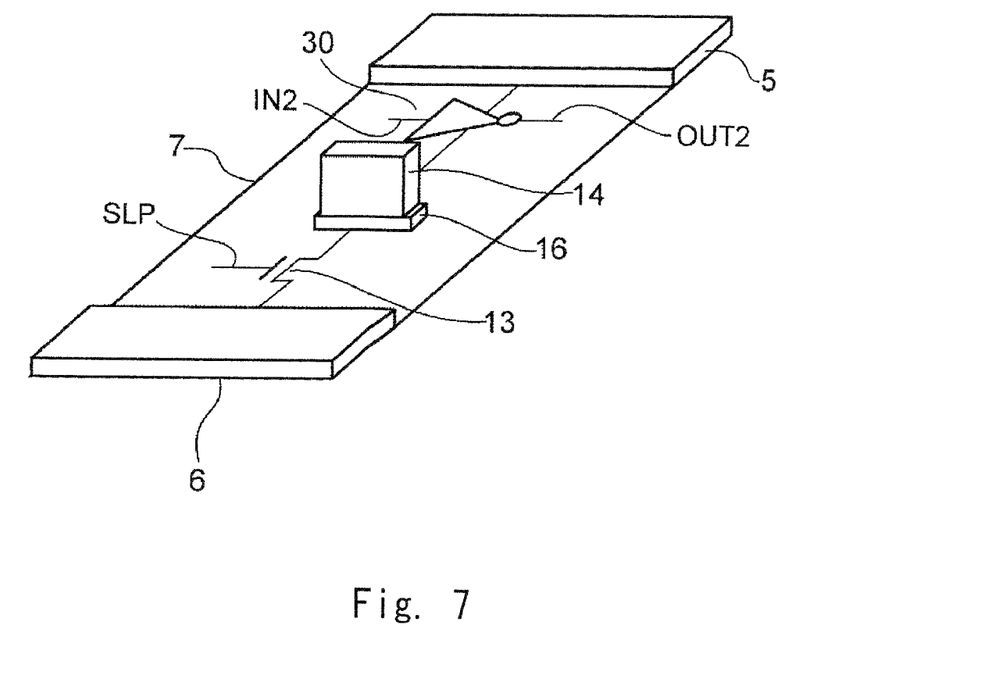
FIG. 7 is a three-dimensional schematic view of a switch cell and a via contact according to the first embodiment of the present invention.
Figure 8:
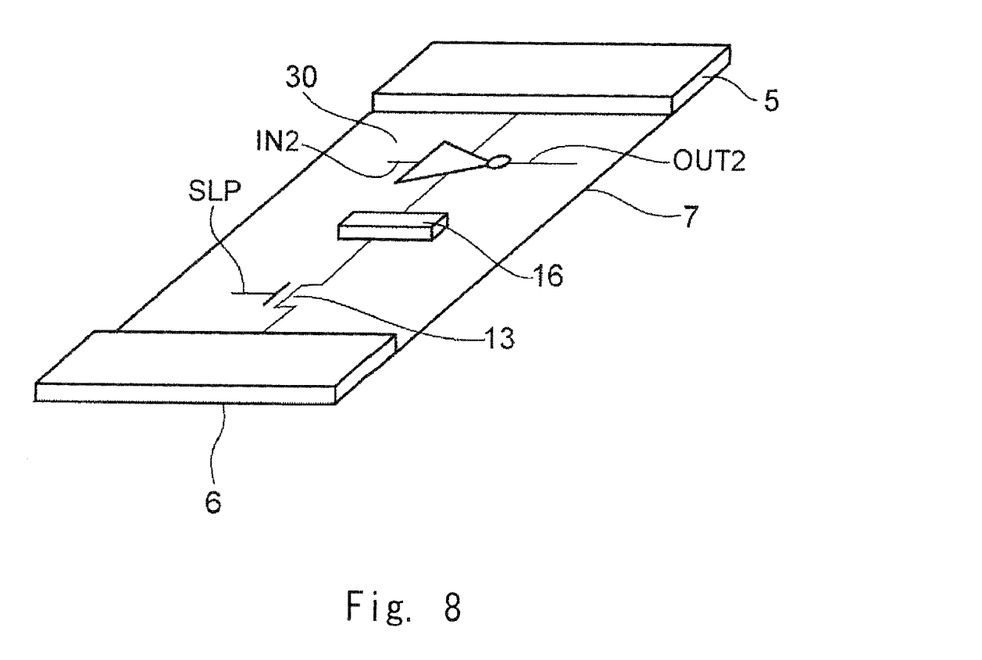
FIG. 8 is a three-dimensional schematic view of the switch cell according to the first embodiment of the present invention.

FIGS. 7 and 8 are three-dimensional schematic views of the switch cell 7 according to this embodiment. Referring to FIG. 7, a power supply terminal of the switch transistor 13 in the switch cell 7 is connected with the first via contact 14 via the metal line 16. FIG. 8 shows the schematic view of FIG. 7 omitting the portion corresponding to the first via contact 14. Referring to FIG. 8, the first local ground line 5, second local power supply line 6 and metal line 16 are provided over the first wiring layer. The metal line 16 corresponds to the first node N1 of FIG. 5.

Figure 9:
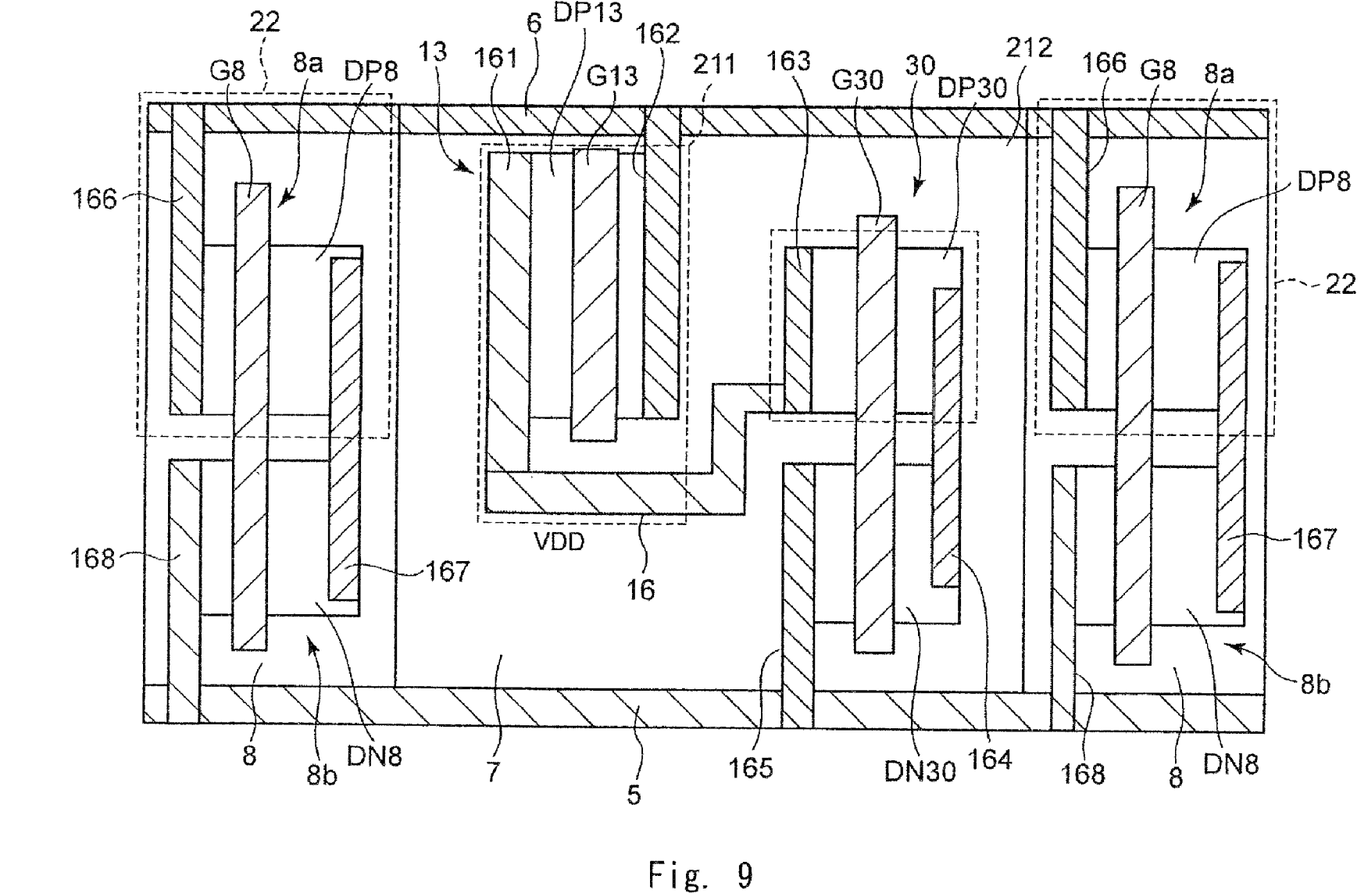
FIG. 9 is a layout diagram of a switch cell and a functional cell according to the first embodiment of the present invention.

FIG. 9 is a layout diagram showing an example of the configuration of the switch cell 7 and functional cell 8 according to this embodiment. The switch cell 7 is formed including first wells 211 and 212 and a metal line 16. As set forth above, the metal line 16 is connected with the global power supply line 11 via the via contact 14. The PMOS transistor included in the switch transistor 13 is formed in the well 211, having source/drain formed in the well 211 and by a diffusion layer DP13 and a gate electrode G13. A source terminal 161 of the PMOS transistor is connected with the metal line 16 and a drain terminal 162 is connected with the second local power supply line 6.

The PMOS transistor included in the repeater circuit 30 is formed in the well 212, having source/drain formed in the well 212 and by a diffusion layer DP30 and a gate electrode G30. The NMOS transistor included in the repeater circuit 30 includes source/drain formed of a diffusion layer DN30 and the gate electrode G30 shared with the PMOS transistor. A source terminal 163 of the PMOS transistor is connected with the metal line 16 and a source terminal 165 of the NMOS transistor is connected with the first local ground terminal 5. Drain terminals of the PMOS transistor and NMOS transistor are short-circuited by a line 164. The input IN2 of an electric signal communicated across the power supply control area 2 is input to the gate electrode G30 and the output OUT2 is output from the line 164.

The functional cell 8 is formed including a second well 22. The first wells 211 and 212 and the second well 22 are electrically isolated from each other. FIG. 9 shows an example in which the functional cell 8 constitutes an inverter. The inverter includes a PMOS transistor 8a having a diffusion layer DP8 as source/drain and a NMOS transistor 8b having a diffusion layer DN8 as source/drain. A source terminal 166 of the PMOS transistor 8a is connected with the second local power supply line 6 and a source terminal 168 of the NMOS transistor 8b is connected with the first local ground line 5. Drain terminals of the transistors 8a and 8b are short-circuited by a line 167 and the transistors share a gate electrode G8.

To dispose the switch cell 7 in the power supply control area 2, the position to dispose the switch cell 7 is determined according to the configurations of the power supply control area 2 and global power supply line 11. To dispose a plurality of switch cells 7 in the power supply control area 2, one switch cell 7 corresponds to one global power supply line 11. Even if there are several switch cells 7 that are connected to one global power supply line 11, the power supply voltage VDD is supplied from one global power supply line 11 to each of the switch cell 7.

As set forth above, there are several global power supply lines 11 provided to the power supply wiring layer. The maximum amount of current flowing each of the global power supply line 11 is previously determined. Thus the size of the switch cell 7 that receives the current supplied from each of the global power supply line 11 is determined according to the maximum amount of current. This enables to control the power supply of the power supply control area 2 regardless of the configuration of the power supply control area 2. That is, the switch transistor 13 included in the switch cell 7 is constituted of a transistor having a gate length (L)/gate width (W) corresponding to the maximum amount of current for the global power supply line 11. This enables to fix the size of the switch cell 7. Further, the plurality of switch cells 7 are disposed in the power supply control area 2 and timings to turn the switch cells on are separated. By doing this, it is possible to suppress rush current generated at a power supply from increasing.

By disposing the switch cell 7 in a area below the global power supply line 11 in vertical direction, the current path from the global power supply line 11 to the second power supply line 6 via the switch cell 7 can be fixed. It is possible to reduce the number of switch cells 7 by increasing the size of the switch cells 7. Therefore, when prioritizing to reduce layout area, a large-sized switch cell 7 is employed and when prioritizing to suppress the rush current, the number of switch cells to dispose is increased and timings to turn each of the switches on are adjusted. Thus it is possible to form a circuit with high versatility.

SECOND EMBODIMENT

Figure 10:
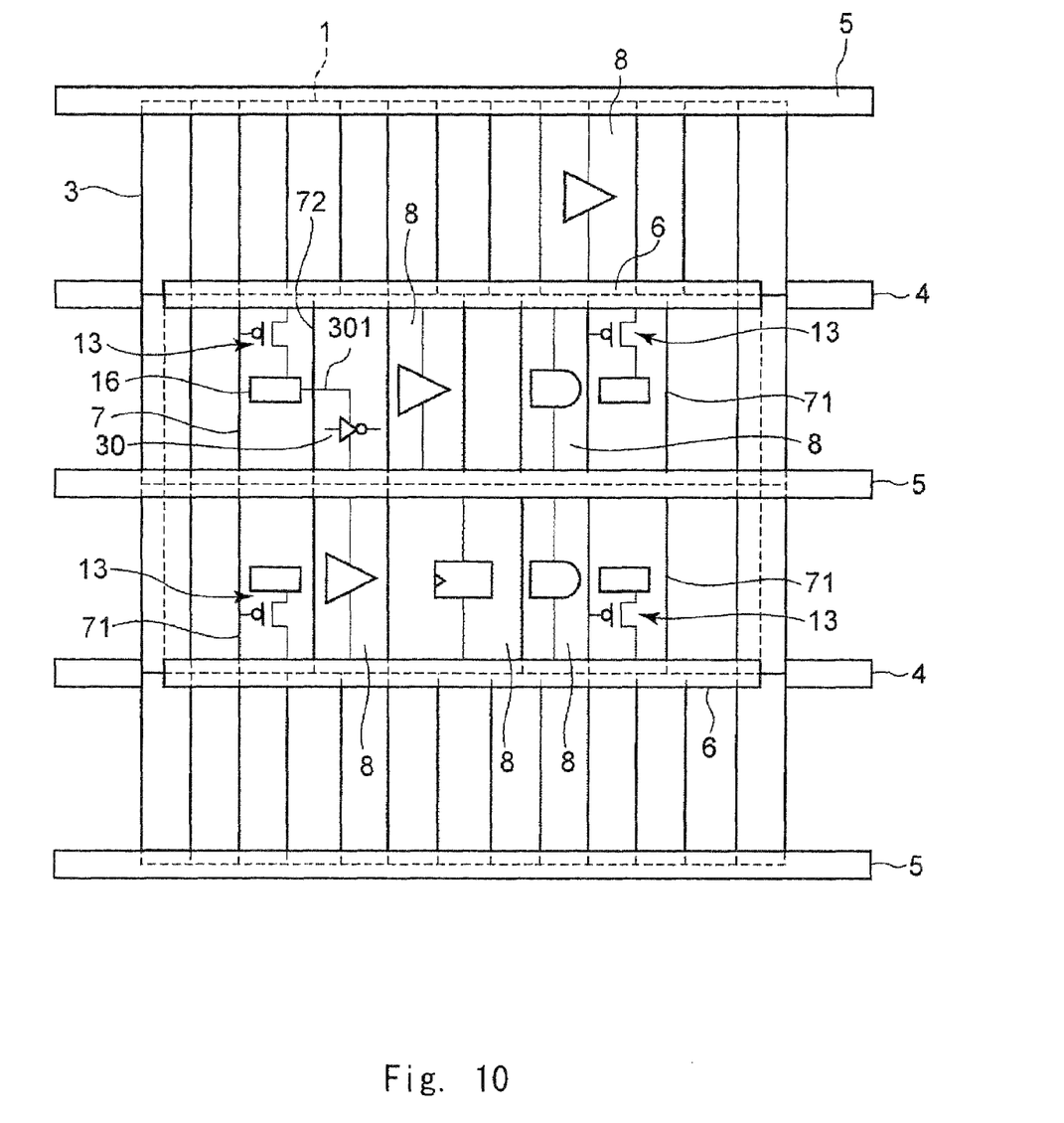
FIG. 10 is a plan view of a second embodiment of the present invention.

FIG. 10 shows a second embodiment of the present invention. A difference of the second embodiment from the first embodiment is that the repeater circuit 30 is provided inside a cell 72 that is adjacent to the switch cell 7, instead of inside the switch cell 7. In this embodiment, a power supply terminal 301 of the repeater circuit 30 inside the cell 72 is electrically connected with the global power supply line 11 via the metal line 16 and first via contact 14 without intervening the switch transistor 13. Accordingly even when the switch transistor 13 is deactivated, the repeater circuit 30 is supplied with the power from the global power supply line 11 to operate.

It is apparent that the present invention is not limited to the above embodiments, but may be modified and changed without departing from the scope and spirit of the invention.

What is claimed is:

1. A semiconductor device, comprising:
   a cell placing area disposed on a semiconductor substrate, the cell placing area including a plurality of basic cells supplied with power from a local power supply line extending along a first direction on the semiconductor substrate;
   a global power supply line to supply power to the local power supply line extending along a second direction on the semiconductor substrate substantially orthogonal to the first direction, the local power supply line being disposed between the substrate and the global power supply line;
   at least one switch cell having a terminal electrically connected to the global power supply line, another terminal electrically connected to the local power supply line and a switch to turn ON and OFF power supply from the global power supply line to the local power supply line; and
   a repeater circuit disposed in the cell placing area, the repeater circuit supplied with power from the global power supply line without interposing the at least one switch,
   wherein the repeater circuit relays a signal through the cell placing area.

2. The semiconductor apparatus according to claim 1, wherein the repeater circuit is provided within the at least one switch cell.

3. The semiconductor device according to claim 2, wherein at least a part of the repeater circuit is overlapped with the global power supply line in a plan view.

4. The semiconductor apparatus according to claim 1, wherein the repeater circuit is provided within a basic cell adjacent to the at least one switch cell.

5. The semiconductor apparatus according to claim 1, further comprising a via contact to connect the global power supply line with the terminal of the switch.

6. The semiconductor device according to claim 5, wherein the via contact and the at least one switch cell are overlapped in a plan view.

7. The semiconductor device according to claim 5, wherein the via contact is disposed between the at least one switch and the inverter.

8. The semiconductor device according to claim 1, wherein at least a part of the global power supply line is overlapped with the cell placing area in a plan view.

9. The semiconductor device according to claim 1, wherein at least a part of the switch is overlapped with the global power supply line in a plan view.

10. The semiconductor apparatus according to claim 1, wherein the at least one switch cell is disposed within the cell placing area.

11. The semiconductor device according to claim 10, wherein the at least one switch cell comprises a plurality of switch cells disposed in the cell placing area and each switch in the plurality of switch cells is turned on and off at different timings.

12. The semiconductor device according to claim 11, wherein among the plurality of switch cells, at least one switch cell does not include the repeater circuit.

13. The semiconductor device according to claim 1, further comprising a power supply control circuit to send a control signal to turn on and off the switch in the at least one switch cell.

14. The semiconductor device according to claim 1, wherein a width of the global power supply line is different than a width of the local power supply line.

15. The semiconductor device according to claim 1, wherein a size of the switch cell is determined by a maximum amount of the power supply received from the global power supply line.

16. The semiconductor device according to claim 1, further comprising a global ground line disposed adjacent to the global power supply line and extending along the second direction, and a local ground line disposed adjacent to the local power supply line and extending along the first direction.

17. The semiconductor device according to claim 1, further comprising another via provided between the global ground line and the local ground line.

18. The semiconductor device according to claim 1, wherein the at least one switch cell and the repeater circuit are formed in the semiconductor substrate.

19. A semiconductor device, comprising:
   a power supply control area including a local power supply line and a plurality of basic cells supply with power from the local power supply line;
   a global power supply line provided within the power supply control area to supply power to the local power supply line, wherein a total area of the local power supply line is larger than a total area of the global power supply line within at least one wiring layer;
   at least one switch cell having a terminal electrically connected to the global power supply line, another terminal electrically connected to the local power supply line and a switch to turn ON and OFF power supply from the global power supply line to the local power supply line; and
   a repeater circuit disposed in the power supply control area, the repeater circuit supplied with power from the global power supply line without interposing the at least one switch,
   wherein the repeater circuit relays a signal through the power supply control area.

20. A semiconductor device, comprising:
   a switch circuit disposed on a semiconductor substrate;
   a repeater circuit being disposed adjacent to the switch circuit on the semiconductor substrate,
   wherein the repeater circuit relays a signal through a first area;
   a global power supply line configured to receive an external power supply within a first wiring layer;

the first area having a first local power supply line within the a second wiring layer, the first local power supply line being coupled to the global power supply line through a first contact;

a second area having a metal line and a second local power supply line within the second wiring layer, the metal line coupled to both the switch circuit and the repeater circuit and coupled to the global power supply line through a second contact, the second local power supply line being coupled to the metal line through the switch circuit, wherein the repeater circuit is provided within the second area, and is supplied with power from the metal line without intervention of the switch circuit.

* * * * *